| United States Patent [19] | [11] Patent Number: 4,792,760 |
| Jacob et al. | [45] Date of Patent: Dec. 20, 1988 |

[54] RECEPTION ANTENNA FOR OPTICAL IMAGE FORMATION DEVICE USING NUCLEAR MAGNETIC RESONANCE

[75] Inventors: Hervé Jacob, Gif-Sur-Yvette; Jean Bussaeri, Ablis, both of France

[73] Assignee: Thomson-CGR, Paris, France

[21] Appl. No.: 10,638

[22] Filed: Feb. 4, 1987

[30] Foreign Application Priority Data

Jul. 2, 1986 [FR] France .................. 86 01722

[51] Int. Cl.$^4$ .............................................. G01R 33/20
[52] U.S. Cl. ...................................... 324/322; 324/318
[58] Field of Search ................ 324/322, 318; 343/743, 343/744, 748, 855, 866

[56] References Cited

U.S. PATENT DOCUMENTS

| 2,517,968 | 8/1950 | Brown .................................. 178/44 |
| 3,210,766 | 10/1965 | Parker ................................ 343/743 |
| 3,550,137 | 12/1970 | Kuecken ............................. 343/744 |
| 3,902,177 | 8/1975 | Mori et al. ........................ 343/748 |
| 4,620,155 | 10/1986 | Edelstein .......................... 324/322 |

FOREIGN PATENT DOCUMENTS 0141383  5/1985  European Pat. Off. .
885620   9/1943  France .
2161940  1/1986  United Kingdom .
8400214  1/1984  World Int. Prop. O. .

OTHER PUBLICATIONS

Funkschau, No. 4, Feb. 11, 1980, pp. 95–96, Munich, DE; West Germany, "Aktive Empfangsantenne".

*Primary Examiner*—Stewart J. Levy
*Assistant Examiner*—Louis M. Arana
*Attorney, Agent, or Firm*—Oblon, Fisher, Spivak, McClelland & Maier

[57] ABSTRACT

In the invention, the quality of the signal received is improved by symmetrizing the antenna. To this end, this antenna comprises two cords each of which has a symmetry with respect to one and the same plane (XOZ). These cords are linked by their ends to antenna tuning capacitors. The received signal is taken up by a high-frequency line integrated to one of the cords at the connection point of one of the tuning capacitors. Furthermore, the other end of this high-frequency line, arranged in the plane of symmetry, is linked to an impedance amplifier-transformer circuit with a high input impedance.

9 Claims, 2 Drawing Sheets

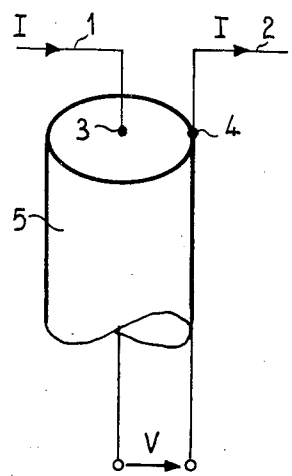
FIG_1-a
PRIOR ART
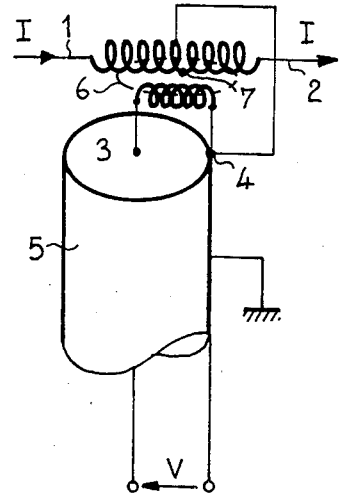
FIG_1-b
PRIOR ART
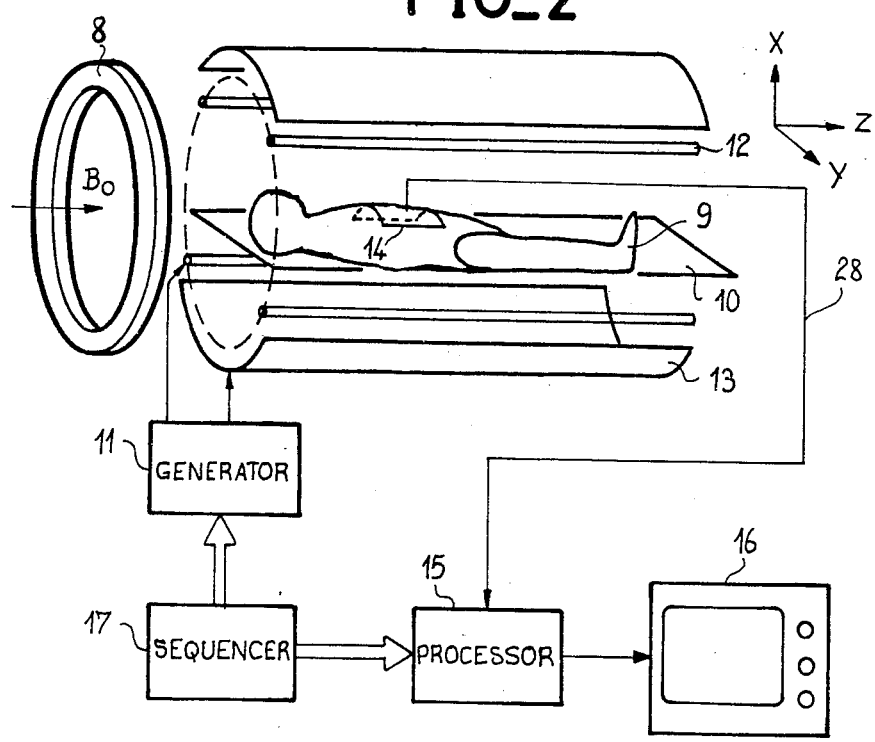
FIG_2

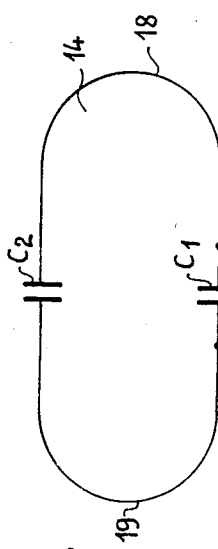
FIG_3-a
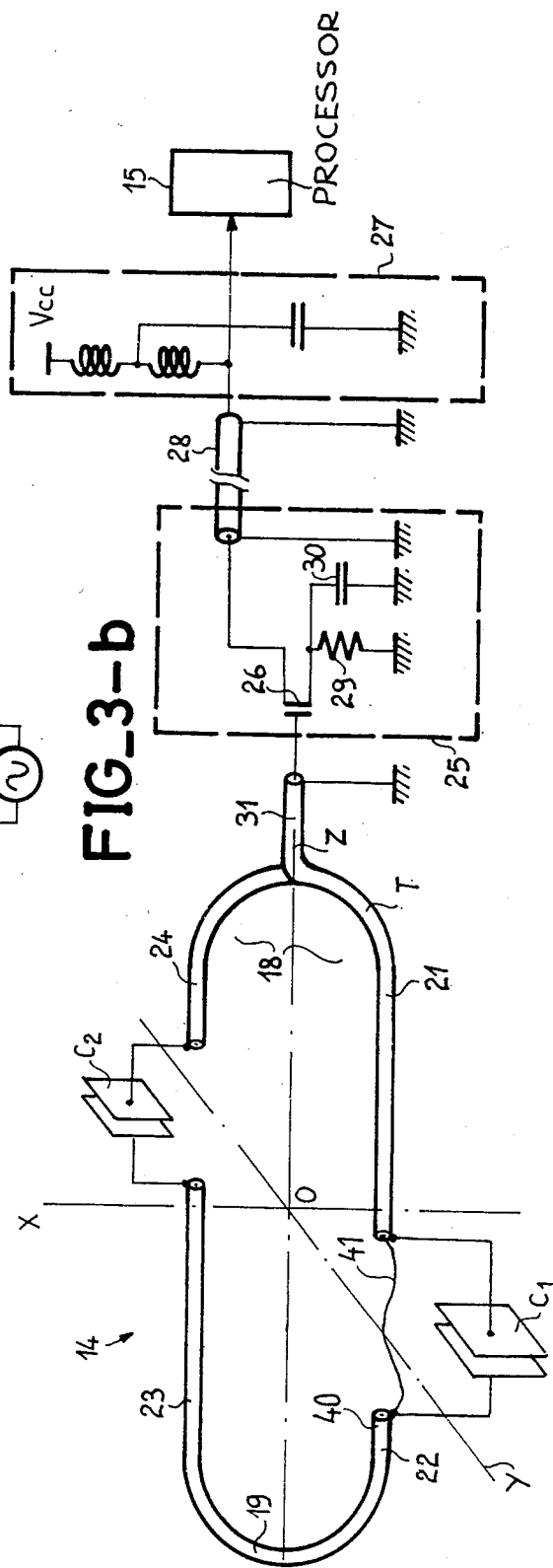
FIG_3-b

RECEPTION ANTENNA FOR OPTICAL IMAGE FORMATION DEVICE USING NUCLEAR MAGNETIC RESONANCE

BACKGROUND OF THE INVENTION

The object of the present invention is a reception antenna for an optical image formation device using nuclear magnetic resonance (NMR). It can be more particularly applied in the field of medicine where optical image formation by NMR is especially valuable as a diagnostic aid. It can, however, be applied in other fields.

FIELD OF THE INVENTION

A device for optical image formation by NMR essentially comprises means by which a body to be examined is subjected to a constant and intense magnetic field $B_O$. Then the body, being subjected to this influence, receives a radio-frequency excitation from an emitting antenna causing a resonance of the oscillation of the magnetic moments of its particles. As soon as this radio-frequency excitation ceases, a measurement is made of the resonance signal emitted in return by the body when the magnetic moments of the particles tend to become realigned with the field $B_O$. To receive the signal emitted, so-called surface antennas are sometimes used. So-called surface antennas are antennas placed on the surface of the body. Their main usefulness, as compared with antennas which are joined to the device, is that they can be placed in the immediate vicinity of the emitting particles. Emitting antenna conventionally fastened to the device are, for their part, substantially further away from the particles. The use of these surface antennas gives distinct improvement in the signal-to-noise ratio of the signal detected. A surface antenna comprises mainly a conductor forming a current loop. The reactive impedance of this antenna circuit is tuned to the resonance frequency by means of a capacitor. The sensitivity of the antenna directly depends on the Q-factor of the circuit thus achieved. In the design of the antenna circuits, the aim is to minimize losses by acting firstly, on the shapes and dimensions of the circuits and, secondly, on the choice of the high-quality components which constitute these circuits.

DESCRIPTION OF THE PRIOR ART

But other conditions also have to be fulfilled, especially to minimize noise. For example, it is known how to distribute the tuning capacitors along the circuit: in so doing, the detection of electrical fields is reduced. The impedances of the self-inducting coils and capacitors constituting the antenna are then diminished, the effect of which is to reduce the voltages at their ends and the resulting electrical field. In other words, the signal of the dielectric loss which appears in the body is not picked up. Furthermore, to ensure the most efficient reception of the resonance signal, this signal is conducted by an adapted line up to a circuit for the processing of the signal. The adapted line is generally a coaxial line with a characteristic impedance of 50 Ohms. Another factor directly affects the quality of the signal received: this factor relates to the symmetrization of the antenna. FIGS. 1a and 1b respectively depict non-symmetrical and symmetrical antennas. In FIG. 1a, two radiating elements 1 and 2 are connected to the core 3 and the braid 4 of a coaxial cable 5. This cable is powered by a signal source V. During transmission or reception, there is an imbalance between the radiating parts: a first part is limited to the antenna element 1 while the other part comprises the antenna element 2 and the braid 4 of the cable 5. FIG. 1b depicts a symmetrizing device known in the prior art. The doublet 1-2 is powered by a magnetic coupling 6, the middle point 7 of whose secondary winding is linked to the braid of the cable 5. The symmetrizing of the power supply in this way prevents any sheath current in the coaxial cable. Thus, the antenna becomes insensitive to external radioelectric disturbances. Unfortunately, this symmetrization by transformer cannot be applied to optical image formation by NMR which is ruled out by the presence of the magnetic coupling 6. The consequence of this is that in NMR the symmetrization is overlooked.

The object of the present invention is to provide a remedy to this disadvantage by proposing symmetrized antennas. For such symmetrization, we propose an original method without any additional magnetic coupling, a method which, at the same time, achieves the adaptation of the antenna impedance. For the coupling 6, which must now be dispensed with, has another characteristic: it adapts the impedance of the antenna 1-2 to the characteristic impedance of the coaxial cable 5.

SUMMARY OF THE INVENTION

The object of the invention is a reception antenna for an optical image formation device using nuclear magnetic resonance, comprising means for its symmetrization in order to receive the resonance signal and a circuit to provide for the transformation of its impedance for the transmission of this resonance signal, a reception antenna wherein the symmetrizing means comprise one resistive loop which is frequency-tuned by a distributed capacitor comprising at least one capacitor arranged symmetrically in the loop and one circuit for the reception of the signal induced in the loop, connected to the terminals of the one of the capacitors, this reception circuit comprising one section of a high-frequency line, one earth conductor of which participates in the resistive loop, one core of this section of high-frequency line, which is used to conduct the received signal, being linked firstly to the rest of the loop and secondly, to the impedance transforming circuit.

BRIEF SUMMARY OF THE DRAWINGS

The invention will be better understood from the following description and the figures which accompany it. These figures are given only by way of indication and in no way limit the scope of the invention. In the figures, the same references designate the same elements. These figures are:

FIG. 1a and b, depicting antenna elements according to the state of the prior art already described above;

FIG. 2, depicting a device for optical image formation by NMR comprising an antenna according to the invention;

FIG. 3a and 3b, a schematic diagram and a particula example of an antenna according to the invention.

DESCRIPTION OF THE PREFERRED EMBODIMENT OF THE INVENTION

FIG. 2 depicts a device for optical image formation by nuclear magnetic resonance. This device essentially comprises first means 8 by which a body 9, supported by a plate 10, is subjected to an intense magnetic field $B_O$. In this situation, the body 9 further receives a radio-frequency excitation produced by generating means 11 and transmitted, for example, by an antenna with four conductors such as the conductor 12. Since the radio-frequency response of the signal is a response in volume, the device further comprises coils 13, called gradient coils, which are also linked to the generating means 11 so as to specify regions in the space where optical images of sections are to be made. For the reception, a surface antenna 14, provided with the improvement of the invention, is placed on the body 9, vertical to these sections. This surface antenna is symmetrized and adapted. It is joined by a line 28 to processing circuits 15 linked to display or storage means 16 in order to display or store the images of the sections. The generating means 11 and the processing circuits 15 are driven by a sequencer 17.

The FIG. 3a schematically depicts the antenna 14 provided with a symmetrizing arrangement. The antenna 14 comprises a current loop made up of two conductor cords 18 and 19 which are curved and symmetrical. These two cords are joined to each other, at their ends, by two capacitors $C_1$ and $C_2$. These capacitors $C_1$ and $C_2$ are calculated so that they set up, with the cords 18 and 19, a high surge voltage for a signal at the resonance frequency. The symmetrization is obtained by connecting a reception circuit 20 to the terminals of one of the two capacitors.

In a special embodiment depicted in FIG. 3b, the assembly complies with that of FIG. 3a and the connection of a preferred reception circuit is shown in greater detail. The antenna exhibits a symmetry in relation to a plane XOZ where Z is colinear with $B_O$ and where X is perpendicular to the plane of the antenna. The result of this symmetry is a partitioning of the loop into four semi-cords marked 21 to 24. The semi-cords 22 and 23 on the one hand and 21 and 24 on the other are of equal length and have the same shape. The semi-cords 22 and 23 are joined together at one of their ends and are joined to capacitors $C_1$ and $C_2$ respectively at their other ends. The semi-cords 21 and 24 are also joined together at one of their ends and are respectively joined to the capacitors $C_1$ and $C_2$ at their other ends. The conductors of the semi-cords have the same section. They may, for example, be hollow conductors.

In the invention, the semi-cord 21 forms, however, with a conductor which is parallel to it, a high-frequency line section T. This section T is longer than a standard semi-cord: the semi-cord 24 itself is electrically linked to a certain point to determine the semi-cord 21 and to form the cord 18 with it. The symmetrization is obtained by connecting the heated point of the line to the end 40 of the semi-cord 22 (connected to the capacitor $C_1$) on the one hand, and to an matching/amplifying circuit 25 on the other hand. In a preferred mode, the semi-cords 22, 23 and 24 are made up of coaxial cable elements, the cores of which, being unnecessary, are left idle. The section T may be made from an identical coaxial cable. In this example, the heated point of the high-frequency line is made up by the core of the section T. It is linked to a connection 41 of the semi-cord 22.

The circuit 25 is placed in the immediate vicinity of the antenna (a few centimetres from it). It comprises essentially a field-effect transistor (FET) 26. The transistor 26 is powered by a decoupled power source 27 of a type known in the prior art, the potential (Vcc) of which is carried by the core of a linking coaxial cable 28. The circuit 25 further comprises a polarizing resistor 29 and a decoupling capacitor 30 mounted as a common emitter. The circuit 25, which constitutes a high input impedance amplifier, transforms the impedance of the antenna 14 to adapt it to that of the line 28. For the equality of the currents circulating in the conducting cords 18 and 19 and in the capacitors $C_1$ and $C_2$ causes a very high impedance of the resonant circuit which is exhibited at the input of the amplifier 25. While this circuit gives out a low charge through the line 28, the circuit 25, through its high input impedance transforms the impedance. The line 28 is also used to convey the received signal towards the processing means 15. In one example, the section T is made from a coaxial cable with a characteristic impedance of 50 Ohms. At a resonance frequency of 20 MHz, the wavelength of the resonance signal is equal to about 15 meters. The section T, the length of which may be about 0.50 meters (far less than a quarter of the wavelength) and which is charged by an almost infinite impedance (that of the circuit 25) behaves like a capacitive impedance with a value $C_T$. The matching/amplifying circuit 25 further has an equivalent alternating pattern comprising a resistor $R_A$ in parallel with a capacitor $C_A$. The frequency tuning of the current loop by the capacitors $C_1$ and $C_2$ is modified by this factor. Thus, $C_1$ is chosen such that:

$$C_2 = C_1 + C_T + C_A.$$

The end 31 of the section T connected to the circuit 25 is colinear with the axis Z. Thus, it is no longer possible for any current in the common mode to circulate in the core of the section T owing to the electrical and mechanical symmetry of the device. In a particular mode of embodiment of the invention, the loop 14 is set up on an insulating sheet made of a flexible and resistant materal; the line section T can be made here in the form of a microstrip. This makes it easier to position it on the body. The circuit 25 is placed directly downstream of the antenna, on the same sheet. The cable 28 links this circuit, placed on the body in the tunnel of the NMR device, to the circuit 15.

What is claimed is:

1. A reception antenna for an optical image formation device using nuclear magnetic resonance by which a body is subjected to a constant magnetic field and to a radio-frequency excitation from an emitting antenna causing a resonance of the oscillation of the magnetic moments of the particles of said body and wherein as soon as said radio-frequency excitation ceases, a measurement is made of the resonant signal emitted by said body when the magnetic moments of the particles tend to become realigned with said constant magnetic field, said reception antenna including a means for symmetrization in order to receive said resonance signal and to provide for the transformation of the impedance of said reception antenna in order to transmit said resonance signal wherein said means for symmetrization and transformation comprises:

a conductive loop which is frequency tuned by at least one capacitor means arranged symmetrically in said conductive loop;

a reception circuit for receiving a signal induced in said conductive loop wherein said reception circuit provides for said impedance transformation and wherein said reception circuit is connected to the terminals of one of said at least one capacitor means and wherein said conductive loop includes a first section comprising a portion of a high frequency line and a second section in series connection to said first section;

wherein said portion of said high frequency line has a ground conductor which is a part of said conductive loop and a core conductor which is connected in order to conduct said resonance signal wherein said core conductor is connected to a terminal of said second section of said loop and to said reception circuit providing said impedance transformation.

2. Antenna according to the claim 1 wherein the loop exhibits a geometrical symmetry with respect to a plane substantially transverse to the plane of said loop.

3. Antenna according to claim 2 wherein the end of the high-frequency line section connected to the impedance transformation circuit is contained in the plane of symmetry.

4. Antenna according to any one of the claims 1, 2, 3 wherein the section of the conductor which forms said second section is that of a coaxial cable identical to that of the high-frequency line section 5. Antenna according to any one of the claims 1, 2, 3 wherein the impedance transformation circuit is a high input impedance circuit.

6. Antenna according to claim 5 wherein the impedance transformation circuit is placed in the immediate vicinity of the antenna.

7. Antenna according to claim 6 wherein the impedance transformation circuit comprises a field effect transistor mounted as a common emitter.

8. Antenna according to the claim 7 wherein the field effect transistor is powered by a polarizing voltage decoupled power source.

9. Antenna according to the claim 3 wherein said at least one capacitor means includes tuning capacitances of two symmetrical parts of the loop wherein said tuning capacitances are equal.

* * * * *